United States Patent
Hatano et al.

(10) Patent No.: US 8,471,442 B2
(45) Date of Patent: Jun. 25, 2013

(54) PIEZOELECTRIC CERAMIC, METHOD FOR PRODUCING SAME, AND PIEZOELECTRIC DEVICE

(75) Inventors: Keiichi Hatano, Takasaki (JP); Yutaka Doshida, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/145,996

(22) PCT Filed: Apr. 30, 2010

(86) PCT No.: PCT/JP2010/057651
§ 371 (c)(1),
(2), (4) Date: Jul. 22, 2011

(87) PCT Pub. No.: WO2010/128647
PCT Pub. Date: Nov. 11, 2010

(65) Prior Publication Data
US 2012/0161588 A1 Jun. 28, 2012

(30) Foreign Application Priority Data
May 8, 2009 (JP) .................. 2009-113419

(51) Int. Cl.
*H01L 41/187* (2006.01)
(52) U.S. Cl.
USPC ............... 310/358; 252/62.9 R; 252/62.9 PZ
(58) Field of Classification Search
USPC ..... 310/311, 366, 365, 358, 357; 252/62.9 R, 252/62.9 PZ; 501/134
See application file for complete search history.

(56) References Cited

U.S. PATENT DOCUMENTS

| | | | |
|---|---|---|---|
| 6,383,411 B1 | 5/2002 | Sawada et al. | |
| 6,387,295 B1 | 5/2002 | Saito | |
| 6,884,364 B2 | 4/2005 | Sato et al. | |
| 7,956,518 B2* | 6/2011 | Ozawa et al. | 310/358 |
| 8,004,161 B2* | 8/2011 | Nagaya et al. | 310/358 |
| 2004/0058797 A1 | 3/2004 | Nonoyama et al. | |
| 2006/0006360 A1* | 1/2006 | Takao et al. | 252/62.9 R |
| 2008/0305332 A1 | 12/2008 | Kimura et al. | |
| 2011/0156540 A1 | 6/2011 | Hatano et al. | |

FOREIGN PATENT DOCUMENTS

| | | |
|---|---|---|
| JP | 2001-130961 A | 5/2001 |
| JP | 2002-241175 A | 8/2002 |
| JP | 2003-201172 A | 7/2003 |

(Continued)

OTHER PUBLICATIONS

Takahashi, Lead-Free Barium Titanate Ceramics with Large Piezoelectric Constant Fabricated by Microwave Sintering, Japanese Journal of Applied Physics vol. 45, No. 1, 2006, pp. L30-L32, published online Dec. 28, 2005.

(Continued)

*Primary Examiner* — Thomas Dougherty
*Assistant Examiner* — Karen B Addison
(74) *Attorney, Agent, or Firm* — Law Office of Katsuhiro Arai

(57) ABSTRACT

Disclosed is a piezoelectric ceramic which is characterized by containing $[K_{1-x}Na_x]_{1-y}Li_y[Nb_{1-z-w}Ta_zSb_w]O_3$ (wherein x, y, z and w each represents a molar ratio and satisfies $0 \leq x \leq 1$, $0 \leq y \leq 1$, $0 \leq z \leq 1$, $0 \leq w \leq 1$) as the main phase and $K_3Nb_3O_6Si_2O_7$ as a sub-phase, while containing, as an additive, a Cu compound in an amount of 0.02-5.0 mol in terms of CuO relative to 100 mol of the main phase.

20 Claims, 3 Drawing Sheets

FOREIGN PATENT DOCUMENTS

| | | |
|---|---|---|
| JP | 2004-075448 A | 3/2004 |
| JP | 2004-075449 A | 3/2004 |
| JP | 3531803 B | 3/2004 |
| JP | 2004-115293 A | 4/2004 |
| JP | 2004-155601 A | 6/2004 |
| JP | 2004-161532 A | 6/2004 |
| JP | 2004-244301 A | 9/2004 |
| JP | 2004-244302 A | 9/2004 |
| JP | 2004-323325 A | 11/2004 |
| JP | 2006-056778 A | 3/2006 |
| JP | 2006-062955 A | 3/2006 |
| JP | 2006-143588 A | 6/2006 |
| JP | 2006-306668 A | 11/2006 |
| JP | 2006-327863 A | 12/2006 |
| JP | 2007-204336 A | 8/2007 |
| JP | 4044943 B | 2/2008 |
| JP | 4044944 B | 2/2008 |
| JP | 2010-052999 A | 3/2010 |
| WO | 2007/080684 A | 7/2007 |

OTHER PUBLICATIONS

Karaki, Lead-Free Piezoelectric Ceramics with Large Dielectric and Piezoelectric Constants Manufactured from BaTiO3 Nano-Powder, Japanese Journal of Applied Physics vol. 46, No. 4, 2007, pp. L97-L98, published online Jan. 19, 2007.

Matsubara, Piezoelectric properties of (K0.5Na0.5)(Nb1-xTax)O3-K5.4CuTa10O29 ceramics, Japanese Journal of Applied Physics 97, 114105 (2005), pp. 1-7, published online May 27, 2005.

Matsubara, Processing and Piezoelectric Properties of Lead-Free (K,NA)(Nb,Ta)O3 Ceramics, Japanese Journal of the American Ceramic Society, vol. 88, No. 5, pp. 1190-1196, May 2005.

\* cited by examiner

PIEZOELECTRIC CERAMIC, METHOD FOR PRODUCING SAME, AND PIEZOELECTRIC DEVICE

This application is the U.S. National Phase under 35 U.S.C. §371 of International Application PCT/JP2010/057651, filed Apr. 30, 2010, which claims priority to Japanese Patent Application No. 2009-113419, filed May 8, 2009. The International Application was published under PCT Article 21(2) in a language other than English.

TECHNICAL FIELD

The present invention relates to a piezoelectric ceramic comprising a lead-free but alkali-containing niobate-type perovskite structure, a manufacturing method of said piezoelectric ceramic, and a piezoelectric sound-generating device, a piezoelectric sensor, piezoelectric actuator, a piezoelectric transformer, a piezoelectric ultrasonic motor or other piezoelectric device using said piezoelectric ceramic.

BACKGROUND ART

A piezoelectric ceramic constitutes an electronic device that converts electrical energy to mechanical energy, or mechanical energy to electrical energy, based on the principle of piezoelectric effect. Many conventional electronic devices have used lead-containing piezoelectric ceramics constituted by two components of $PbTiO_3$, and $PbZrO_3$ (hereinafter sometimes referred to as "PZT") or composite perovskite piezoelectric ceramics combining this PZT with the third component such as $Pb(Mg_{1/3}Nb_{2/3})O_3$ or $Pb(Zn_{1/3}Nb_{2/3})O_3$.

However, these electronic devices contain Pb as a main component and therefore present problems in terms of high environmental burdens generated from volatilization of PbO in the production process, for example. This gives rise to a need to develop piezoelectric, ceramics free from Pb or containing less Pb.

Examples of Pb-free piezoelectric ceramics include, among others, a composition comprising a perovskite structure constituted by $BaTiO_3$ (refer to Non-patent Literatures 1 and 2), a composition of perovskite structure containing a bismuth constituted by two components of $(Bi_{1/2}Na_{1/2})TiO_3$ and $(Bi_{1/2}K_{1/2})TiO_3$ (refer to Patent Literatures 1 to 4), a composition comprising a tungsten bronze structure whose main component is $(Ba, Sr, Ca)_2NaNb_5O_{15}$ (refer to Patent Literatures 5 to 7), a composition comprising a bismuth layer structure whose main component is $SrBi_2Nb_2O_9$ (refer to Patent Literatures 8 to 10), and a composition comprising an alkali-containing niobate-type perovskite structure whose main component is $KNbO_3$—$NaNbO_3$—$LiNbO_3$ (refer to Patent Literatures 11 to 13). Among others, the piezoelectric ceramics whose main component is $KNbO_3$, particularly, offer relatively high piezoelectric characteristics and are expected to replace lead-containing piezoelectric ceramics.

With piezoelectric sensors such as acceleration sensors, impact sensors and knock sensors, the higher the voltage generated in response to the input mechanical stress such as acceleration, impact or pressure, the better the sensor sensitivity becomes. Accordingly, piezoelectric ceramics used to constitute these sensors should desirably have as high an electromechanical coupling coefficient (such as $k_{31}$) as possible and as low a dielectric constant (such as $\in_{33}^T/\in_0$) as possible. In general, electric charge C that generates when mechanical stress is given to piezoelectric ceramics becomes higher when the electromechanical coupling constant is higher. Also, electric charge C is proportional to the product of dielectric constant $\in$ and voltage V (in other words, the relationship of $C \propto \in V$ holds). Accordingly, voltage V that generates is proportional to $C/\in$ if the electromechanical coupling constant and the acceleration added by mechanical stress are both constant (in other words, the relationship of $V \propto C/\in$ holds), meaning that the lower the dielectric constant $\in$, the higher the generated voltage becomes. In the case of an acceleration sensor, it is desirable to use piezoelectric ceramics whose mechanical quality coefficient (Qm) is relatively high. When the mechanical quality coefficient is high, energy loss occurring in the ceramics can be kept low. The response, therefore, increases, and consequently the heat generation caused by continuous acceleration, impact or pressure can be suppressed. As explained above, piezoelectric ceramics used for acceleration sensors, etc., should ideally have a high electromechanical coupling coefficient, low dielectric constant, and high mechanical quality coefficient.

Patent Literature 14 disclosed that when CuO is added to piezoelectric ceramics whose main component is $KNbO_3$, the dielectric constant can be lowered and mechanical quality coefficient raised without lowering the electromechanical coupling coefficient. Also in Non-patent Literatures 3, 4 and Patent Literature 15, ceramics comprising a tungsten bronze structure, such as $K_4CuNb_8O_{23}$, $K_5Cu_2Nb_{11}O_{30}$, $K_{5.4}Cu_{1.3}Ta_{10}O_{29}$, are proposed as additives comprising the same effect as CuO.

PRIOR ART LITERATURES

Non-Patent Literatures

Non-patent Literature 1: Japanese Journal of Applied Physics Vol. 45, No. 1, 2006, pp. L30-L32
Non-patent Literature 2: Japanese Journal of Applied Physics Vol. 46, No. 4, 2007, pp. L97-L98
Non-patent Literature 3: Japanese Journal of Applied Physics 97, 114105 (2005)
Non-patent Literature 4: Japanese Journal of the American Ceramic Society Vol. 88, No. 5, 1190-1196 (2005)

Patent Literatures

Patent Literature 1: Japanese Patent Laid-open No. 2003-201172
Patent Literature 2: Japanese Patent Laid-open No. 2004-075449
Patent Literature 3: Japanese Patent No. 4044943
Patent Literature 4: Japanese Patent No. 4044944
Patent Literature 5: Japanese Patent Laid-open No. 2004-075448
Patent Literature 6: Japanese Patent Laid-open No. 2004-161532
Patent Literature 7: Japanese Patent Laid-open No. 2006-143588
Patent Literature 8: Japanese Patent Laid-open No. 2001-130961
Patent Literature 9: Japanese Patent Laid-open No. 2002-241175
Patent Literature 10: Japanese Patent Laid-open No. 2006-062955
Patent Literature 11: Japanese Patent Laid-open No. 2006-056778
Patent Literature 12: Japanese Patent Laid-open No. 2007-204336
Patent Literature 13: Japanese Patent Laid-open No. 2004-244301
Patent Literature 14: Japanese Patent No. 3531803

Patent Literature 15: Japanese Patent Laid-open No. 2004-115293

SUMMARY OF THE INVENTION

Problems to be Solved by the Invention

Alkali-containing niobate-type piezoelectric ceramics to which Cu compound has been added, however, tends to allow crystal grains constituting the ceramics to grow in size during sintering, as a result of which bulky crystal grains exceeding 10 μm in maximum diameter precipitate easily. If such bulky crystal grains exist, concentration of electric field or stress will occur and dielectric breakdown may result. This is particularly true with laminated piezoelectric devices and membrane piezoelectric devices whose piezoelectric ceramic layer is thin.

Various embodiments under the present invention can suppress precipitation of bulky crystal grains and provide a piezoelectric ceramic comprising a relatively high mechanical quality coefficient and relatively low dielectric constant.

Means for Solving the Problems

In an embodiment of the present invention, the piezoelectric ceramic is constituted by polycrystal comprising a main phase constituted by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively) and a sub-phase constituted by $K_3Nb_3O_6Si_2O_7$; wherein 0.02 mol to 5.0 mols of Cu compound is contained relative to 100 mols of the main phase in equivalent CuO.

According to the piezoelectric ceramic in an embodiment of the present invention, the mechanical quality coefficient can be improved and the dielectric constant lowered, without lowering the electromechanical coupling coefficient, due to the action of Cu compound. Also, growth of grains can be suppressed by the action of $K_3Nb_3O_6Si_2O_7$ during sintering, thereby suppressing precipitation of bulky crystal grains.

According to the piezoelectric ceramic in an embodiment of the present invention, $K_3Nb_3O_6Si_2O_7$ is contained by 0.003 to 0.10 in mol ratio relative to the main phase. $K_3Nb_3O_6Si_2O_7$ suppresses grain growth regardless of the amount of its content, but if the content exceeds the specified level, piezoelectric characteristics may deteriorate. The inventor of the present invention confirmed that, as long as the content of $K_3Nb_3O_6Si_2O_7$ is 0.10 or less in mol ratio relative to the main phase, sufficient piezoelectric characteristics would be maintained. Upon the analysis via the X-ray diffraction method, sufficient piezoelectric characteristics can also be maintained when the ratio of line intensity $I_1$ along the most intensive line in the diffraction profile corresponding to the crystal phase of $[K_{1-x}Na_x]_{1-y}Li_y[Nb_{1-z-w}Ta_zSb_w]O_3$ constituting the main phase on one hand, and line intensity $I_2$ along the most intensive line in the diffraction profile corresponding to the crystal phase of $K_3Nb_3O_6Si_2O_7$ constituting the sub-phase on the other, or $I_2/I_1$, is between 0.6% and 8.0%.

For the Cu compound, $CuNb_2O_6$, $K_4CuNb_8O_{23}$, $K_5Cu_2Nb_{11}O_{30}$ or $K_{5.4}Cu_{1.3}Ta_{10}O_{29}$ is preferred. If the Cu compound is any one of the foregoing, the mechanical quality coefficient can be raised and the dielectric constant lowered, without lowering the electromechanical coupling coefficient, in a more favorable manner.

The piezoelectric device in an embodiment of the present invention is constituted by the piezoelectric ceramic provided by one of various embodiments of the present invention. The piezoelectric ceramic in an embodiment of the present invention is particularly suitable for a piezoelectric device that converts mechanical stress to electric signal, such as an acceleration sensor, an impact sensor or a knock sensor. Examples of such piezoelectric device include at least the following: a unimorph device comprising its first electrode and second electrode arranged in a manner facing each other on both sides of the piezoelectric ceramic, formed in the shape of a sheet, provided by one of various embodiments of the present invention; a bimorph or laminated device comprising multiple first electrodes and multiple second electrodes that are stacked on top of one another alternately via layers of the piezoelectric ceramic provided by one of various embodiments of the present invention; and a piezoelectric device constituted by a Si wafer or other semiconductor substrate or alumina substrate or other insulation substrate on which the piezoelectric ceramic provided by one of various embodiments of the present invention is formed, and then first and second electrodes are formed on top of the piezoelectric ceramic.

Also, in an embodiment of the present invention, a manufacturing method of a piezoelectric ceramic consists of: a step to obtain a perovskite composition expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively); a step to obtain a composition expressed by $K_3Nb_3O_6Si_2O_7$; a step to mix the aforementioned $[K_{1-x}Na_x]_{1-y}Li_y[Nb_{1-z-w}Ta_zSb_w]O_3$ and $K_3Nb_3O_6Si_2O_7$; a step to add Cu compound by a ratio of 0.02 mol to 5.0 mols relative to 100 mols of the aforementioned $[K_{1-x}Na_x]_{1-y}Li_y[Nb_{1-z-w}Ta_zSb_w]O_3$ in equivalent CuO and mix the components together; and a step to form and sinter this mixture to which Cu compound has been added. As explained above, under the manufacturing method of a piezoelectric ceramic in an embodiment of the present invention, Cu compound is added to a mixture of main phase and sub-phase and this mixture to which Cu compound has been added is formed and sintered.

In other embodiment of the present invention, the manufacturing method of a piezoelectric ceramic consists of: a step to obtain a composition expressed by $K_3Nb_3O_6Si_2O_7$; a step to mix potassium compound, sodium compound, lithium compound, niobium compound, tantalum compound and antimony compound so as to obtain a perovskite compound expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively); a step to mix this compound with the aforementioned $K_3Nb_3O_6Si_2O_7$; a step to pre-sinter the obtained mixture; a step to add Cu compound to this pre-sintered mixture by a ratio of 0.02 mol to 5.0 mols relative to 100 mols of the aforementioned $[K_{1-x}Na_x]_{1-y}Li_y[Nb_{1-z-w}Ta_zSb_w]O_3$ in equivalent CuO and mix the components together; and a step to form and sinter the obtained mixture. In an embodiment of the present invention, the manufacturing method of a piezoelectric ceramic is characterized by adding Cu compound to the materials constituting the main phase and pre-synthesized sub-phase that have been mixed and pre-sintered beforehand.

Effects of the Invention

According to various embodiments of the present invention, precipitation of bulky crystal grains can be suppressed, and the piezoelectric ceramic comprising both a relatively high mechanical quality coefficient and relatively low dielectric constant is provided.

MODE FOR CARRYING OUT THE INVENTION

Figure 1:
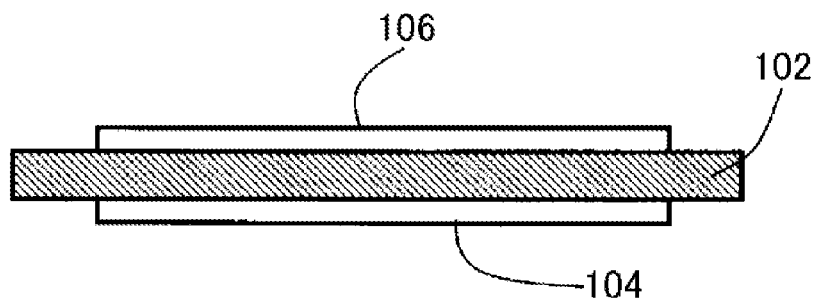
FIG. 1 Side view showing an example of the piezoelectric device provided in an embodiment of the present invention.

In an embodiment of the present invention, the piezoelectric ceramic is constituted by polycrystal comprising a main phase constituted by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively) and a sub-phase constituted by $K_3Nb_3O_6Si_2O_7$; wherein said polycrystal contains Cu compound. Since $K_3Nb_3O_6Si_2O_7$ is contained as the sub-phase, the polycrystalline structure in the piezoelectric ceramic becomes fine and uniform. Since x and y can each take any value in the range of 0 or more but 1 or less, in an embodiment of the present invention the piezoelectric ceramic only needs to contain one of K, Na and Li. In other words, K, Na and Li are all optional constituents of the piezoelectric ceramic in an embodiment of the present invention. In addition, z and w can also take any value in the range of 0 or more but 1 or less, and then in an embodiment of the present invention the piezoelectric ceramic only needs to contain one of Nb, Ta and Sb. In other words, Nb, Ta and Sb are all optional constituents of the piezoelectric ceramic in an embodiment of the present invention.

In an embodiment of the present invention, the piezoelectric ceramic can be such that, when its composition formula is expressed by (1-a) $[K_{1-x}Na_x]_{1-y}Li_y[Nb_{1-z-w}Ta_zSb_w]O_3 + aK_3Nb_3O_6Si_2O_7$ (where a indicates the mol ratio), this mol ratio is specified by $0.003 \leq a \leq 0.10$. In another embodiment of the present invention, this mol ratio can be specified by $0.006 \leq a \leq 0.08$. Within the range of $a \leq 0.003$, the polycrystalline structure in the piezoelectric ceramic has been confirmed to become fine. However, $K_3Nb_3O_6Si_2O_7$ itself has no piezoelectric effect and if a exceeds 0.10, piezoelectric characteristics drop compared to when no $K_3Nb_3O_6Si_2O_7$ is contained, which makes it difficult to achieve a high electromechanical coupling coefficient and low dielectric constant.

In an embodiment of the present invention, the main phase of piezoelectric ceramic is expressed by the composition formula $([K_{1-x}Na_x]_{1-y}Li_y)(Nb_{1-z-w}Ta_zSb_w)O_3$ where x, y, z and w are specified by $0 \leq x \leq 1.0$, $0 \leq y \leq 0.20$, $0 \leq z \leq 0.40$, and $0 \leq w \leq 0.20$, respectively. When x, y, z and w are in these ranges, the piezoelectric ceramic can achieve a high electromechanical coupling coefficient and low dielectric constant, and also have a sufficient resistivity because the Curie temperature is 150° C. or above. It suffices that either K or Na is contained as the A site element.

In an embodiment of the present invention, the main phase of the piezoelectric ceramic is expressed by the composition formula $([K_{1-x}Na_x]_{1-y}Li_y)(Nb_{1-z-w}Ta_zSb_w)O_3$ where x, y, z and w are specified by $0 \leq x \leq 1.0$, $0 \leq y \leq 0.15$, $0 \leq z \leq 0.20$, and $0 \leq w \leq 0.10$, respectively, and a is specified by $0.006 \leq a \leq 0.08$. When x, y, z and w are in these ranges, the piezoelectric ceramic can maintain its piezoelectric effect even at high temperatures of up to 200° C. because the Curie temperature is high at 200° C. or above, which makes it possible to achieve a low dielectric constant ($\epsilon_{33}^T/\epsilon_0$), low dielectric loss (tan $\delta$) and high electromechanical coupling coefficient ($k_{31}$), and the polycrystalline structure of the piezoelectric ceramic is also uniform.

In an embodiment of the present invention, the piezoelectric ceramic contains 0.02 mol to 5.0 mols of Cu compound relative to 100 mols of the aforementioned main phase in equivalent CuO, in addition to comprising the aforementioned main phase and sub-phase. By adding Cu compound according to the above content ratio, the dielectric constant can be lowered and the mechanical quality coefficient improved, without virtually lowering the electromechanical coupling coefficient.

In an embodiment of the present invention, the piezoelectric ceramic contains 0.02 mol to 2.0 mols of Cu compound relative to 100 mols of the aforementioned main phase in equivalent CuO, in addition to comprising the aforementioned main phase and sub-phase. By adding Cu compound according to the above content ratio, the dielectric constant can be lowered and the mechanical quality coefficient improved, without virtually lowering the electromechanical coupling coefficient, while dielectric loss can also be reduced at the same time.

For the Cu compound, $CuNb_2O_6$, $K_4CuNb_8O_{23}$, $K_5Cu_2Nb_{11}O_{30}$ or $K_{5.4}Cu_{13}Ta_{10}O_{29}$ may be used. These Cu compounds can exhibit the expected action of Cu compound without impairing the action of $K_3Nb_3O_6Si_2O_7$ constituting the sub-phase.

Also, the sintering temperature or grain growth can be controlled or the life of the piezoelectric ceramic can be extended in the presence of a high electric field, by adding to the piezoelectric ceramic in an embodiment of the present invention at least one of primary transition elements such as Sc, Ti, V, Cr, Mn, Fe, Co, Ni and Zn, secondary transition elements such as Y, Zr, Mo, Ru, Rh, Pd and Ag, and tertiary transition elements such as La, Ce, Pr, Nd, Sm, Eu, Gd, Tb, Dy, Ho, Er, Tm, Yb, Lu, Hf, W, Re, Os, Ir, Pt and Au, by a specified amount.

In an embodiment of the present invention, the manufacturing method of a piezoelectric ceramic consists of: a step to obtain a perovskite composition expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively); a step to obtain a composition expressed by $K_3Nb_3O_6Si_2O_7$; a step to mix the aforementioned $[K_{1-x}Na_x]_{1-y}Li_y[Nb_{1-z-w}Ta_zSb_w]O_3$ as the main phase and the aforementioned $K_3Nb_3O_6Si_2O_7$ as the sub-phase; a step to add Cu compound to the obtained mixture of both compositions by a ratio of 0.02 mol to 5.0 mols relative to 100 mols of the aforementioned $[K_{1-x}Na_x]_{1-y}Li_y[Nb_{1-z-w}Ta_zSb_w]O_3$ in equivalent CuO and mix the components together; and a step to form and sinter this mixture to which Cu compound has been added.

In an embodiment of the present invention, the manufacturing method of a piezoelectric ceramic consists of: a step to obtain a composition expressed by $K_3Nb_3O_6Si_2O_7$; a step to mix potassium compound, sodium compound, lithium compound, niobium compound, tantalum compound and antimony compound so as to obtain a perovskite compound expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively) and mix this compound with the aforementioned $K_3Nb_3O_6Si_2O_7$; a step to pre-sinter the obtained mixture; a step to add Cu compound to this pre-sintered mixture by a ratio of 0.02 mol to 5.0 mols relative to 100 mols of the aforementioned $[K_{1-x}Na_x]_{1-y}Li_y[Nb_{1-z-w}$ $Ta_zSb_w]O_3$ in equivalent CuO and mix the components together; and a step to form and sinter the obtained mixture.

Here, to manufacture a piezoelectric ceramic using the manufacturing method of a piezoelectric ceramic in an embodiment of the present invention, $K_2CO_3$ or $KHCO_3$ can be used for the material containing potassium; $Na_2CO_3$ or $NaHCO_3$ can be used for the material containing sodium; $Li_2CO_3$ can be used as the material containing lithium; $Nb_2O_5$ can be used as the material containing niobium; $Ta_2O_5$ can be used as the material containing tantalum; and $Sb_2O_3$ or $Sb_2O_5$ can be used as the material containing antimony, respectively. $SiO_2$ can be used as the material containing silicon which is used to obtain $K_3Nb_3O_6Si_2O_7$. By using these materials, blending, agitation, pre-sintering and other processes can be performed easily and the target substance can be synthesized without giving undue burdens to the manufacturing process. In an embodiment of the present invention, pre-sintering can be performed at 700 to 1000° C., and polyvinyl alcohol, polyvinyl butylal or any of various other binders, which are generally used, can be used as the binder for powder forming. Sintering can be performed at 1040 to 1180° C.

In an embodiment of the present invention, the piezoelectric ceramic comprises a perovskite structure generally expressed by $ABO_3$. Here, the element located at position A is K, Na or Li, where the element located at position B is Nb, Ta or Sb. When the stoichiometric ratio becomes A:B=1:1, elements are available at all site positions to achieve a stable structure. However, the composition may vary by several percent (2% or less) in the manufacturing process due to causes such as elution of K, Na or Li due to moisture, volatilization of K, Na, Li or Sb in the pre-sintering process, and volatilization of K, Na, Li or Sb in the sintering process. The degree of variation in the composition of constituents is affected by change in each material, timing of synthesis and synthesis process. To address such variation, at the time of initial blending, slightly more of the source materials for K, Na, Li and Sb are added, just enough to offset the decreases in their amounts in the manufacturing process. In this way, the composition of the piezoelectric ceramic obtained by the sintering process becomes closer to A:B=1:1. To achieve high piezoelectric effect, it is desirable that the ratio of A site and B site of the manufactured piezoelectric ceramic be kept in the range of 0.96<A/B<1.002.

In an embodiment of the present invention, $CuNb_2O_6$ can be used as the Cu compound to be added to the piezoelectric ceramic. $CuNb_2O_6$ can be incorporated, as solid solution, into the main phase comprising a perovskite structure in the sintering stage. The added $CuNb_2O_6$ dissolves as $Cu^{2+}$ by causing a defect at the A site of the main phase comprising a perovskite structure, or as $Cu^+$ without causing a defect at the site. Since the A site component becomes excessive as a result, Nb of $CuNb_2O_6$ dissolves at the B site in a manner achieving a condition close to the ideal ratio of A:B=1:1. Accordingly, the composition of the alkali-containing niobate-type perovskite compound constituting the main phase of the piezoelectric ceramic proposed by the present invention is expressed by $[K_{1-x}Na_x]_{1-y}Li_yCu_i[Nb_{1-z-w}Ta_zSb_w]O_3$ (where i is a real value in the range of 0<i<1.0, achievable when $CuNb_2O_6$ that has been contained as an additive dissolves).

Regardless of whether or not the Cu compound dissolves, in an embodiment of the present invention the piezoelectric ceramic can suppress precipitation of bulky crystal grains in its polycrystalline structure by causing $K_3Nb_3O_6Si_2O_7$ constituting the sub-phase to precipitate.

In an embodiment of the present invention, the Cu compound added to the piezoelectric ceramic can not only dissolve in the alkali-containing niobate-type perovskite compound as $CuNb_2O_6$, but it can also precipitate as a crystal phase comprising a tungsten bronze structure such as $K_4CuNb_8O_{23}$, $K_5Cu_2Nb_{11}O_{30}$ or $K_{5.4}Cu_{1.3}Ta_{10}O_{29}$. Accordingly, the additive to be used need not be $CuNb_2O_6$, but $K_4CuNb_8O_{23}$, $K_5Cu_2Nb_{11}O_{30}$, $K_{5.4}Cu_{1.3}Ta_{10}O_{29}$ or any other Cu compound comprising a tungsten bronze structure can be used.

Regardless of whether or not such crystal phase comprising a tungsten bronze structure precipitates, in an embodiment of the present invention the piezoelectric ceramic can suppress precipitation of bulky crystal grains in its polycrystalline structure by causing $K_3Nb_3O_6Si_2O_7$ constituting the sub-phase to precipitate.

Furthermore, the Cu compound may be synthesized before the main phase and sub-phase are mixed; or CuO or $Cu_2O$ and $Nb_2O_5$ may be added in an unsynthesized form to the main phase and sub-phase at a ratio constituting Cu compound, and then mixed. In other words, any mixing order can be followed as long as the composition of the obtained piezoelectric ceramic falls within the range specified by a given embodiment of the present invention.

In an embodiment of the present invention, the obtained piezoelectric ceramic may have a relative density of 95% or more in its sintered form. Also in an embodiment of the present invention, the ratio of the line intensity along the most intensive line corresponding to the perovskite compound phase that expresses the piezoelectric effect on one hand, and the line intensity along the most intensive line corresponding to the silicon-containing phase expressed by $K_3Nb_3O_6Si_2O_7$ on the other, falls in the range of 0.6% to 8.0% (line intensity ratio), with respect to the diffraction profile obtained via the X-ray diffraction on the powder which had been obtained by crushing the sintered sample of the piezoelectric ceramic.

Next, a piezoelectric device pertaining to an embodiment of the present invention is explained. FIG. 1 is a side view of a piezoelectric device pertaining to an embodiment of the present invention. This piezoelectric device has a sheet-shaped piezoelectric ceramics layer 102, a first electrode 104 positioned on the back side of this piezoelectric ceramics layer 102, and a second electrode 106 positioned on the front side of the piezoelectric ceramics layer 102 in a manner facing the first electrode 104. This piezoelectric ceramics layer 102 can be manufactured according to the various embodiments of the present invention as described above. For example, the piezoelectric device illustrated in FIG. 1 can be obtained as follows. First, piezoelectric ceramics mixture powder is mixed with binder and then formed in a shape of rectangle, rough circle, or ring, and the shaped mixture is sintered to form the sheet-shaped piezoelectric ceramics layer 102. A conductive paste based on Cu, Ag or other conductor is applied on both sides of this piezoelectric ceramics layer 102 and the layer is baked to form the first electrode 104 on the back side of the piezoelectric ceramics layer 102 and the second electrode 106 on the front side. In this way, the piezoelectric device shown in FIG. 1 is obtained. When the piezoelectric ceramics obtained by any one of various embodiments of the present invention is used as this piezoelectric ceramics layer 102, a piezoelectric device achieving minimum loss and having a relatively high electromechanical coupling coefficient can be obtained. This piezoelectric device can be applied, for example, to a pressure sensor, an impact sensor or other sensor to achieve high sensitivity and minimum loss.

Figure 2:
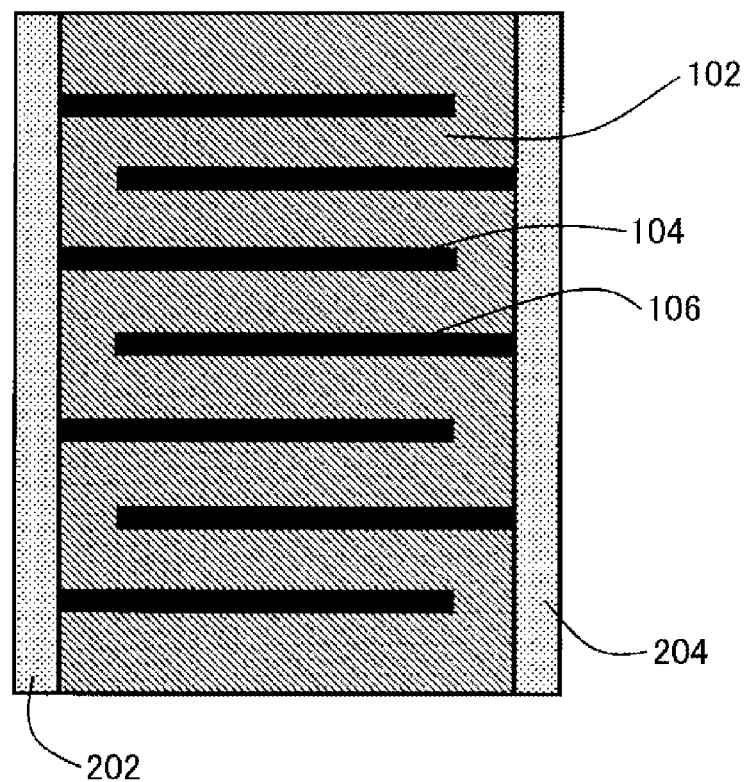
FIG. 2 Schematic section view showing an example of the piezoelectric device provided in an embodiment of the present invention.

FIG. 2 is a section view showing a schematic illustration of a laminated piezoelectric device pertaining to an embodiment of the present invention. This piezoelectric device is constituted by first electrodes 104 and second electrodes 106 stacked on top of one another alternately via piezoelectric ceramic layers 102. Provided on one side face of this laminated piezoelectric device is a first terminal electrode 202 that electrically connects to the first electrodes 104, while a second terminal electrode 204 that electrically connects to the second electrodes 106 is provided on the other side face. This laminated piezoelectric device is used as a laminated piezoelectric actuator, etc. When the piezoelectric ceramic obtained by any one of various embodiments of the present invention is used as this piezoelectric ceramic layer 102, a piezoelectric device achieving minimum loss and comprising a relatively high electromechanical coupling coefficient can be obtained. Also, growth of crystal grains is suppressed and thus the obtained piezoelectric ceramic layer is dense and rarely undergoes dielectric breakdown. Accordingly, the piezoelectric ceramic layer 102 can be made thin, and thus a smaller laminated piezoelectric actuator, etc., offering favorable characteristics with less power consumption can be obtained.

Figure 3:
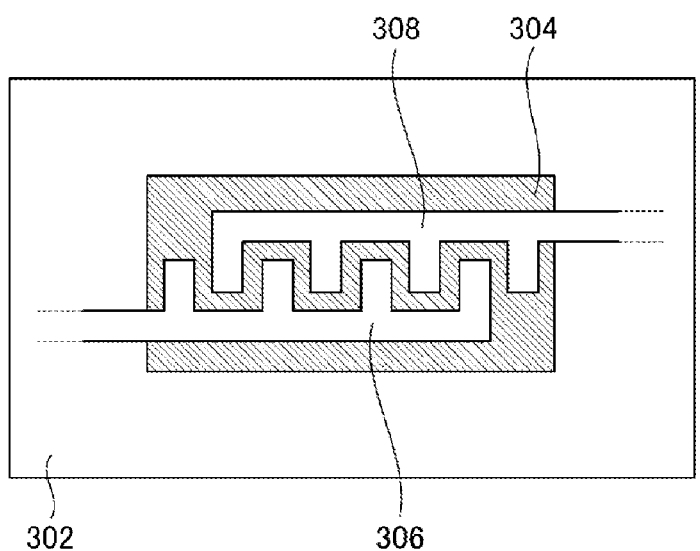
FIG. 3 Plan view showing an example of the piezoelectric device provided in an embodiment of the present invention.

FIG. 3 is a plain view showing a schematics illustration of a surface acoustic wave filter (SAW filter) pertaining to an embodiment of the present invention. This piezoelectric device comprises a substrate 302, piezoelectric ceramic layer 304 formed on this substrate 302, a first electrode 306 positioned on the front surface of this piezoelectric ceramic layer 304, and a second electrode 308 positioned on the front surface of the piezoelectric ceramic layer 304 in a manner facing the first electrode 306. When the piezoelectric ceramic obtained by any one of various embodiments of the present invention is used as this piezoelectric ceramic layer 304, a SAW filter achieving minimum loss can be obtained.

Figure 4:
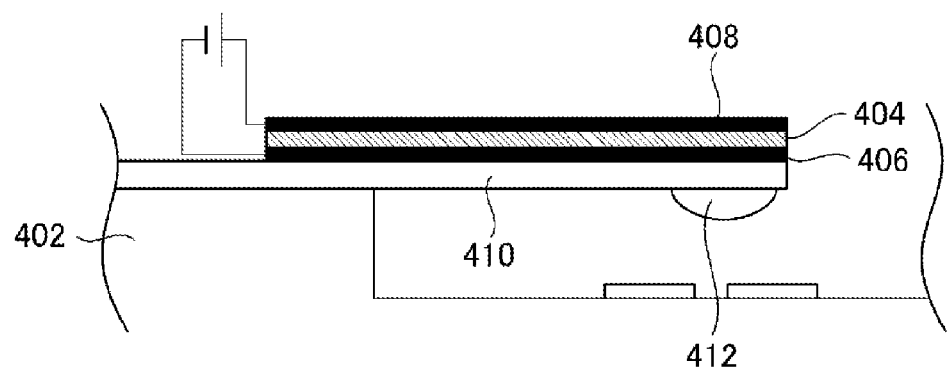
FIG. 4 Schematic section view showing an example of the piezoelectric device provided in an embodiment of the present invention.

FIG. 4 is a section view showing a schematic illustration of a switching element that uses a multi-morph piezoelectric actuator pertaining to an embodiment of the present invention. This multi-morph piezoelectric actuator comprises a substrate 402, a first electrode 406 positioned on the front surface of this substrate 402 via a sheet-shaped elastic body 410, a second electrode 408 positioned in a manner corresponding to this first electrode 406 via a piezoelectric ceramic layer 404, and a movable contact 412 positioned at the tip of the elastic body 410 in a manner facing a fixed contact formed on the substrate 402. When voltage is applied, the piezoelectric ceramic layer 404 flexes downward together with the elastic body 410, the first electrode 406 and the second electrode 408, and then the moving contact 412 contacts the fixed contact. When the voltage application is stopped, each part returns to its original position and the moving contact 412 separates from the fixed contact. When the piezoelectric ceramic obtained by any one of various embodiments of the present invention is used as this piezoelectric ceramic layer 404, a piezoelectric actuator achieving minimum loss can be obtained and the power consumption of the switching element can be reduced. Note that, although shown in FIG. 4 is a unimorph piezoelectric actuator comprising one piezoelectric ceramic layer, it is clear to those skilled in the art that a bimorph or multi-morph piezoelectric actuator comprising two or more layers is also acceptable.

Next, the evaluation results of the piezoelectric ceramic expressed by $(1-a)$ $[K_{1-x}Na_{x}]_{1-y}Li_{y}[Nb_{1-z-w}Ta_{z}Sb_{w}]O_{3}+ aK_{3}Nb_{3}O_{6}Si_{2}O_{7}$ (where $0 \leq x \leq 1$, $0 \leq y \leq 1$, $0 \leq z \leq 1$, and $0 \leq w \leq 1$, respectively) according to an embodiment of the present invention are explained by comparing them with the evaluation results of other piezoelectric ceramics. To verify the characteristics of piezoelectric ceramics in embodiments of the present invention, samples indicated by sample numbers 1 to 49 in Table 1 were evaluated, respectively. In Table 1, those samples marked with * to the left of the sample number (such as the sample indicated by sample number 1) and others marked with ** (such as sample indicated by sample number 12) are piezoelectric ceramics not included in the scope of the present invention, while those samples not marked with * or ** (such as the sample indicated by sample number 6) are piezoelectric ceramics manufactured according to embodiments of the present invention.

TABLE 1

| Sample number | a | x | y | z | w | m |
|---|---|---|---|---|---|---|
| *1 | 0.00 | 0.50 | 0.00 | 0.00 | 0.00 | 0.0 |
| *2 | 0.03 | 0.50 | 0.00 | 0.00 | 0.00 | 0.0 |
| *3 | 0.06 | 0.50 | 0.00 | 0.00 | 0.00 | 0.0 |
| *4 | 0.00 | 0.50 | 0.00 | 0.00 | 0.00 | 0.5 |
| *5 | 0.00 | 0.50 | 0.00 | 0.00 | 0.00 | 2.0 |
| 6 | 0.03 | 0.50 | 0.00 | 0.00 | 0.00 | 0.02 |
| 7 | 0.03 | 0.50 | 0.00 | 0.00 | 0.00 | 0.2 |
| 8 | 0.03 | 0.50 | 0.00 | 0.00 | 0.00 | 0.5 |
| 9 | 0.03 | 0.50 | 0.00 | 0.00 | 0.00 | 1.0 |
| 10 | 0.03 | 0.50 | 0.00 | 0.00 | 0.00 | 2.0 |
| 11 | 0.03 | 0.50 | 0.00 | 0.00 | 0.00 | 5.0 |
| **12 | 0.03 | 0.50 | 0.00 | 0.00 | 0.00 | 8.0 |
| 13 | 0.06 | 0.50 | 0.00 | 0.00 | 0.00 | 0.5 |
| 14 | 0.06 | 0.50 | 0.00 | 0.00 | 0.00 | 1.0 |
| 15 | 0.06 | 0.50 | 0.00 | 0.00 | 0.00 | 2.0 |
| 16 | 0.003 | 0.50 | 0.00 | 0.00 | 0.00 | 0.5 |
| 17 | 0.10 | 0.50 | 0.00 | 0.00 | 0.00 | 0.5 |
| *18 | 0.12 | 0.50 | 0.00 | 0.00 | 0.00 | 0.5 |
| **19 | 0.03 | 0.00 | 0.00 | 0.00 | 0.00 | 0.0 |
| 20 | 0.03 | 0.00 | 0.00 | 0.00 | 0.00 | 0.5 |
| *21 | 0.03 | 0.30 | 0.00 | 0.00 | 0.00 | 0.0 |
| 22 | 0.03 | 0.30 | 0.00 | 0.00 | 0.00 | 0.5 |
| *23 | 0.03 | 0.55 | 0.00 | 0.00 | 0.00 | 0.0 |
| 24 | 0.03 | 0.55 | 0.00 | 0.00 | 0.00 | 0.5 |
| *25 | 0.03 | 0.60 | 0.00 | 0.00 | 0.00 | 0.0 |
| 26 | 0.03 | 0.60 | 0.00 | 0.00 | 0.00 | 0.5 |
| *27 | 0.03 | 0.50 | 0.00 | 0.10 | 0.00 | 0.0 |
| 28 | 0.03 | 0.50 | 0.00 | 0.10 | 0.00 | 0.2 |
| 29 | 0.03 | 0.50 | 0.00 | 0.10 | 0.00 | 0.5 |
| 30 | 0.03 | 0.50 | 0.00 | 0.10 | 0.00 | 1.0 |
| *31 | 0.03 | 0.50 | 0.00 | 0.20 | 0.00 | 0.0 |
| 32 | 0.03 | 0.50 | 0.00 | 0.20 | 0.00 | 0.2 |
| 33 | 0.03 | 0.50 | 0.00 | 0.20 | 0.00 | 0.5 |
| 34 | 0.03 | 0.50 | 0.00 | 0.20 | 0.00 | 1.0 |
| 35 | 0.03 | 0.50 | 0.00 | 0.20 | 0.00 | 2.0 |
| *36 | 0.03 | 0.50 | 0.01 | 0.00 | 0.00 | 0.0 |
| 37 | 0.03 | 0.50 | 0.01 | 0.00 | 0.00 | 0.5 |
| 38 | 0.01 | 0.50 | 0.03 | 0.00 | 0.00 | 0.5 |
| 39 | 0.03 | 0.50 | 0.03 | 0.00 | 0.00 | 0.5 |
| *40 | 0.01 | 0.50 | 0.06 | 0.00 | 0.00 | 0.0 |
| 41 | 0.01 | 0.50 | 0.06 | 0.00 | 0.00 | 0.5 |
| 42 | 0.03 | 0.50 | 0.06 | 0.00 | 0.00 | 0.5 |
| *43 | 0.03 | 0.50 | 0.03 | 0.20 | 0.00 | 0.0 |
| 44 | 0.03 | 0.50 | 0.03 | 0.20 | 0.00 | 0.5 |
| 45 | 0.03 | 0.50 | 0.03 | 0.20 | 0.00 | 1.0 |
| *46 | 0.03 | 0.50 | 0.04 | 0.10 | 0.04 | 0.0 |
| 47 | 0.03 | 0.50 | 0.04 | 0.10 | 0.04 | 0.5 |
| 48 | 0.03 | 0.50 | 0.04 | 0.10 | 0.04 | 1.0 |
| 49 | 0.03 | 0.50 | 0.04 | 0.10 | 0.04 | 2.0 |

Each sample shown in Table 1 was prepared as follows. First, $K_{2}CO_{3}$ (or $KHCO_{3}$), $Na_{2}CO_{3}$ (or $NaHCO_{3}$) and $Nb_{2}O_{5}$ of 99% or above in purity, pre-synthesized $K_{3}Nb_{3}O_{6}Si_{2}O_{7}$, as well as $Li_{2}CO_{3}$, $Ta_{2}O_{5}$, $Sb_{2}O_{3}$ (or $Sb_{2}O_{5}$), if necessary, were prepared as the materials for piezoelectric ceramics. These materials were then blended into 49 different patterns according to the composition ratios of a, x, y, z and w shown in Table 1.

Thereafter, the blended materials were transferred into a ball mill together with ethanol and then mixed for 24 hours. Next, the mixture was put in a dryer set at 100° C. to evaporate ethanol, after which the obtained mixture was pre-sintered for 3 hours at 950° C. The pre-sintered mixture was then transferred into a ball mill together with ethanol and crushed for 24 hours, after which the crushed pieces were put in a dryer set at 100° C. to evaporate ethanol. Next, CuO (or $Cu_2O$) and $Nb_2O_5$ of 99% or above in purity were prepared at a ratio giving the chemical structure $CuNb_2O_6$, and the amount specified by m in Table 1 was added as an auxiliary to the dried material mixture. The value of m in Table 1 indicates the additive amount of $CuNb_2O_6$ by the number of mols (in equivalent CuO) relative to 100 mols of the main phase. The mixture to which this auxiliary had been added was transferred into a ball mill together with ethanol and then mixed for 24 hours, and dried to obtain piezoelectric ceramic powder.

Next, polyvinyl alcohol was added to the obtained piezoelectric ceramic powder as a binder to form pellets. The obtained powder pellets were then pressure-formed into a disc shape of 0.6 mm in thickness and 10 mm in diameter. Next, this formed disc was sintered for 2 hours in atmosphere under normal pressure at temperatures of 1060 to 1160° C. An Ag conductive paste was applied via a screen printing to both sides of the sintered disc-shaped sample, which was then baked at 800° C. to form electrodes. Next, this disc-shaped sample was put in an oil bath of 150° C. and an electric field of 3 kV/mm was applied for 15 minutes via the electrodes to perform polarization.

The polarized disc sample was let stand overnight, and then measured for four piezoelectric characteristics including the dielectric constant ($\epsilon_{33}^T/\epsilon_0$), dielectric loss (tan $\delta$), the electromechanical coupling coefficient ($k_{31}$) in 31 directions, and the mechanical quality coefficient (Qm), using the resonance-anti-resonance method. All measurements were carried out according to EMAS-6100, which is the standard set forth by the Society of Materials Science, Japan.

Also, a scanning electron microscope (SEM) was used to observe the polycrystalline structure of each sample in a sintered form. The grain size was evaluated by the photograph method, where a desired number of horizontal straight lines were drawn on the obtained photograph and both the average length and maximum length of/among grains crossed by these straight lines were obtained using an imaging analyzer. The obtained values are hereinafter referred to as the average grain size and the maximum grain size, respectively. As a reference, at least 400 grains were measured.

Figure 5:
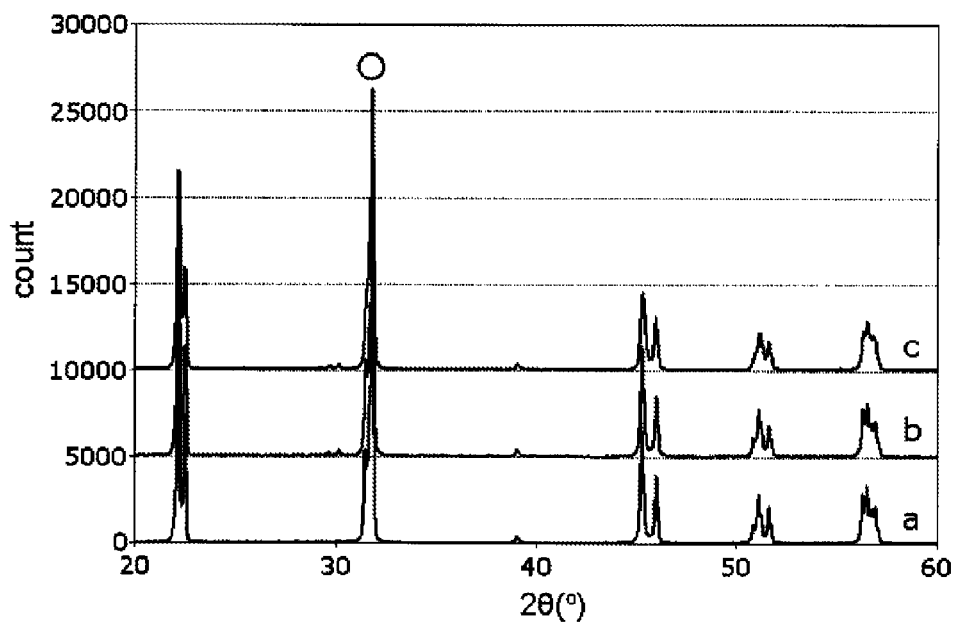
FIG. 5 Graph showing a diffraction profile of $20° \leq 2\theta \leq 60°$ based on X-ray diffraction method using Cu—K$\alpha$ line.
Figure 6:
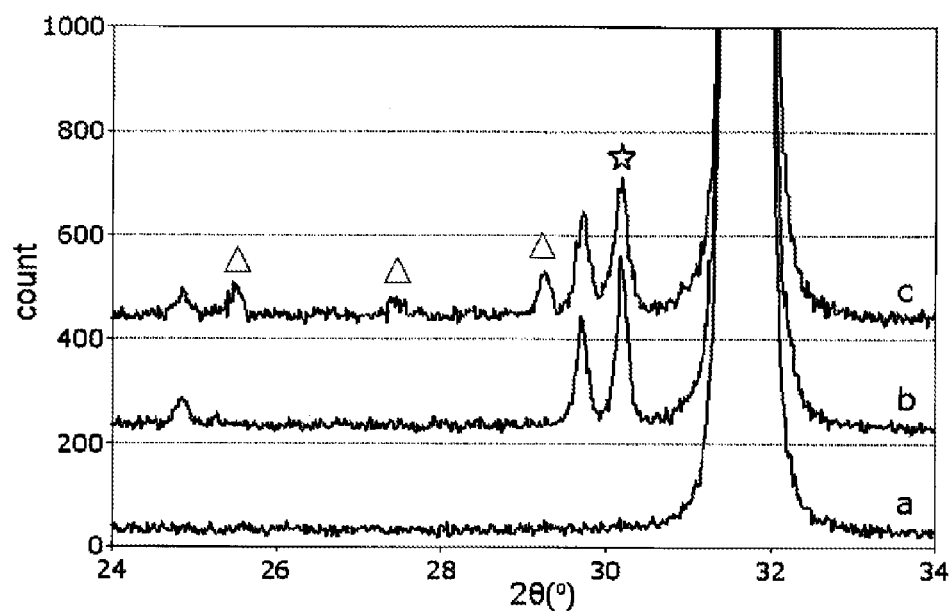
FIG. 6 Graph showing an enlarged view of a part of the diffraction profile of FIG. 5 at $24° \leq 2\theta \leq 34°$.

To identify the crystal phase that precipitated in the obtained sintered sample, the sintered sample was crushed for 30 minutes in an agate mortar to obtain a powder sample, which was then measured by the X-ray diffraction method (hereinafter referred to as "XRD") to obtain a diffraction profile. The line source used was Cu—K$\alpha$ line, with the tube voltage, tube current and scan speed set to 50 kV, 100 mA and 0.02°/sec, respectively. Using a condensing optical system, 2$\theta$/$\theta$ scan was performed to obtain the diffraction profile of 20° 2$\theta$≦60° shown in FIG. 5. As a result, all samples other than samples 1, 4 and 5 were confirmed to have precipitated a phase comprising an alkali-containing niobate-type perovskite structure which constitutes the main phase, as well as $K_3Nb_3O_6Si_2O_7$ constituting the sub-phase (secondary phase). Furthermore, precipitation of crystal phase comprising a tungsten bronze structure was confirmed with samples to which at least 1.0 mol of $CuNb_2O_6$ was mixed (such as samples 2, 9 and 10). As an example, FIGS. 5 and 6 show the diffraction profiles measured for sample numbers 1, 2, and 9. Then, the line intensity along the most intensive line corresponding to the main phase denoted by a circle in FIG. 5, and the line intensity along the most intensive line corresponding to the secondary phase denoted by a star in FIG. 6, were evaluated and the ratio of the two was used to evaluate the precipitation amount of $K_3Nb_3O_6Si_2O_7$. In other words, the following calculation was formed for evaluation:

$I_2/I_1$=<Precipitation amount of $K_3Nb_3O_6Si_2O_7$>=<Line intensity along the most intensive line corresponding to $K_3Nb_3O_6Si_2O_7$>/<Line intensity along the most intensive line corresponding to the main phase>

It should be noted that the XRD measurement was performed using the RINT-2500/PC manufactured by Rigaku, which has its headquarters located in Akishima-shi, Tokyo. Also note that the diffraction profiles denoted by triangles in FIG. 6 indicate crystal phases comprising a tungsten bronze structure. For $I_1$ and $I_2$, the peak heights from count zero were used.

The values obtained as above are summarized in Table 2.

TABLE 2

| Sample number | Specific dielectric constant $\epsilon_{33}^T/\epsilon_0$ | Electromechanical coupling constant $k_{31}$ (%) | Mechanical quality coefficient Qm | Dielectric loss tan $\delta$ (%) | $I_2/I_1$ (%) | Average grain size (μm) | Maximum grain size (μm) |
|---|---|---|---|---|---|---|---|
| ✗1 | 440 | 20 | 100 | 7.4 | 0.0 | 3.0 | 12 |
| ✗2 | 500 | 23 | 100 | 2.5 | 2.7 | 1.0 | 4.0 |
| ✗3 | 580 | 21 | 100 | 2.8 | 5.1 | 1.0 | 3.0 |
| ✗4 | 280 | 24 | 1300 | 1.4 | 0.0 | 6.0 | 22 |
| ✗5 | 260 | 20 | 400 | 6.0 | 0.0 | 6.0 | 25 |
| 6 | 490 | 23 | 110 | 2.5 | 2.7 | 2.0 | 4.0 |
| 7 | 440 | 21 | 170 | 2.5 | 2.3 | 1.0 | 4.0 |
| 8 | 290 | 24 | 1600 | 1.0 | 2.0 | 1.0 | 4.0 |
| 9 | 290 | 23 | 1400 | 2.3 | 1.9 | 1.0 | 5.0 |
| 10 | 300 | 22 | 1300 | 2.3 | 1.2 | 2.0 | 7.0 |
| 11 | 480 | 19 | 1200 | 3.5 | 0.8 | 4.0 | 9.0 |
| ✗✗12 | | | Polarization was not possible | | | | |
| 13 | 320 | 21 | 1500 | 1.2 | 3.9 | 1.0 | 3.0 |
| 14 | 330 | 21 | 1100 | 2.9 | 3.5 | 1.0 | 4.0 |
| 15 | 350 | 19 | 950 | 3.0 | 1.2 | 1.0 | 6.0 |
| 16 | 300 | 24 | 1100 | 1.2 | 0.6 | 5.0 | 20 |
| 17 | 550 | 18 | 600 | 3.2 | 8.0 | 2.0 | 5.0 |
| ✗18 | 500 | 14 | 200 | 4.9 | 10.5 | 1.0 | 5.0 |
| ✗✗19 | | | Sintering was not possible. | | | | |
| 20 | 230 | 19 | 900 | 3.1 | 1.7 | 1.0 | 5.0 |
| ✗21 | 280 | 20 | 90 | 4.5 | 1.8 | 2.0 | 4.0 |
| 22 | 230 | 20 | 1400 | 1.9 | 1.6 | 2.0 | 5.0 |
| ✗23 | 500 | 22 | 120 | 2.3 | 2.6 | 2.0 | 4.0 |
| 24 | 270 | 22 | 1700 | 0.9 | 1.8 | 2.0 | 5.0 |

TABLE 2-continued

| Sample number | Specific dielectric constant $\epsilon_{33}^T/\epsilon_0$ | Electro-mechanical coupling constant $k_{31}$ (%) | Mechanical quality coefficient Qm | Dielectric loss tan δ (%) | $I_2/I_1$ (%) | Average grain size (μm) | Maximum grain size (μm) |
|---|---|---|---|---|---|---|---|
| X25 | 470 | 20 | 140 | 2.1 | 2.6 | 2.0 | 5.0 |
| 26 | 260 | 21 | 1700 | 1.0 | 1.6 | 3.0 | 5.0 |
| X27 | 510 | 26 | 200 | 1.9 | 2.8 | 1.0 | 3.0 |
| 28 | 450 | 26 | 320 | 1.5 | 2.2 | 1.0 | 3.0 |
| 29 | 330 | 27 | 1600 | 0.9 | 1.8 | 1.0 | 4.0 |
| 30 | 320 | 27 | 1500 | 1.0 | 1.6 | 3.0 | 6.0 |
| X31 | 830 | 23 | 90 | 2.7 | 2.8 | 1.0 | 3.0 |
| 32 | 790 | 24 | 180 | 2.4 | 2.3 | 1.0 | 3.0 |
| 33 | 480 | 24 | 1400 | 1.4 | 2.1 | 1.0 | 3.0 |
| 34 | 490 | 23 | 1400 | 2.1 | 1.8 | 2.0 | 6.0 |
| 35 | 500 | 23 | 1200 | 2.3 | 1.1 | 4.0 | 8.0 |
| X36 | 520 | 24 | 130 | 2.1 | 2.7 | 1.0 | 4.0 |
| 37 | 330 | 24 | 1800 | 0.8 | 2.6 | 1.0 | 3.0 |
| 38 | 340 | 22 | 1600 | 0.9 | 0.8 | 2.0 | 5.0 |
| 39 | 360 | 23 | 1700 | 1.1 | 2.6 | 1.0 | 4.0 |
| X40 | 740 | 24 | 100 | 2.9 | 0.7 | 3.0 | 6.0 |
| 41 | 640 | 23 | 240 | 1.9 | 0.7 | 2.0 | 6.0 |
| 42 | 650 | 24 | 280 | 1.5 | 2.5 | 1.0 | 3.0 |
| X43 | 1260 | 26 | 70 | 2.1 | 2.7 | 1.0 | 3.0 |
| 44 | 940 | 27 | 310 | 1.4 | 1.9 | 1.0 | 3.0 |
| 45 | 1040 | 26 | 260 | 1.8 | 1.7 | 1.0 | 3.0 |
| X46 | 1480 | 27 | 50 | 2.5 | 2.9 | 2.0 | 7.0 |
| 47 | 1170 | 27 | 210 | 1.4 | 2.1 | 2.0 | 6.0 |
| 48 | 1210 | 27 | 210 | 1.8 | 2.0 | 1.0 | 7.0 |
| 49 | 1260 | 26 | 180 | 2.3 | 1.2 | 2.0 | 10 |

By adding $K_3Nb_3O_6Si_2O_7$ according to an embodiment of the present invention, various effects can be achieved. For example, the comparison of samples 1, 2 and 3 finds that the average grain size and the maximum grain size decreased when $K_3Nb_3O_6Si_2O_7$ was added. Also from the comparison of samples 4 and 8, and comparison of samples 5 and 10, it is clear that the average grain size and the maximum grain size decreased with the addition of $K_3Nb_3O_6Si_2O_7$. On the other hand, the comparison of samples 2 and 8, and comparison of samples 3 and 13, show that adding $K_3Nb_3O_6Si_2O_7$ suppressed the growth of crystal grains, regardless of the availability of Cu compound. In addition, results of samples 4, 8, 13, 16 and 17 indicate that the growth of crystal grains were suppressed when a was in the range of $0.003 \leq a \leq 0.1$. Note that, although suppression of grain growth was observed with sample 18 containing $K_3Nb_3O_6Si_2O_7$, its piezoelectric characteristics were lower than those of sample 4 not containing $K_3Nb_3O_6Si_2O_7$. Furthermore, all samples within the scope of the present invention had their $I_2/I_1$ in the range of 0.6% to 8.0%.

Various effects can be achieved with the addition of Cu compound according to an embodiment of the present invention. For example, the experimental results of samples 2 and 6 to 12 shown in Table 2 confirmed that these samples whose additive amount m of Cu compound was controlled within the range of 0.02 to 5.0 had lower dielectric constants and improved mechanical quality coefficients compared to sample 2 not containing CU compound. Furthermore, the experimental results of samples 8 to 10 show that, by controlling the additive amount m of Cu compound within the range of $0.5 \leq m \leq 2.0$, the dielectric constant can be lowered and the mechanical quality coefficient improved significantly, while maintaining the electromechanical coupling coefficient, and the dielectric loss can also be reduced. Based on this, a more preferred range of the additive amount m of Cu compound is $0.5 \leq m \leq 2.0$. Note that measurement of piezoelectric characteristics was not possible with sample 12 because polarization could not be performed for that sample.

In addition, the comparison of sample 3 with samples 13 to 15 indicates that, when the content of $K_3Nb_3O_6Si_2O_7$ was at least equivalent to a=0.06, addition of Cu compound according to various embodiments of the present invention reduced the dielectric constant and improve the mechanical quality coefficient significantly, while maintaining the electromechanical coupling coefficient, and also reducing the dielectric loss.

It is also clear from the comparison of samples 21 and 22, comparison of samples 23 and 24, and comparison of samples 25 and 26 that, regardless of the ratio of K and Na in the main phase, addition of Cu compound reduced the dielectric constant and improved the mechanical quality coefficient significantly, while maintaining the electromechanical coupling coefficient, and also reducing the dielectric loss. Measured results could not be obtained for sample 19, at least for certain items in Table 2, because sintering was not performed.

On the other hand, the results of samples 27 to 35 show that, even when Nb in the main phase is partially substituted by Ta, addition of Cu compound reduced the dielectric constant and improved the mechanical quality coefficient significantly, while maintaining the electromechanical coupling coefficient, and also reducing the dielectric loss, regardless of the ratio of substitution. Since Nb and Ta are both elements in the vanadium and have common properties, those skilled in the art should easily understand that changing the blending ratio of these elements would not affect the characteristics of the formed piezoelectric ceramics in any significant way.

Also from the experimental results of samples 36 to 42, it is clear that, even if the A site of the main phase, or specifically K and Na, is partially substituted by Li, the addition of Cu compound reduced the dielectric constant and improved the mechanical quality coefficient significantly, while maintaining the electromechanical coupling coefficient, and also reduced the dielectric loss, regardless of the ratio of substitution. Since K, Na and Li are all alkali metals and have common properties, those skilled in the art should easily understand that changing the blending ratio of these elements would not affect the characteristics of the formed piezoelectric ceramics in any significant way.

Furthermore, the experimental results of samples 43 to 49 indicate that, even if Nb in the main phase is partially substituted by Sb, the addition of Cu compound reduced the dielectric constant and improved the mechanical quality coefficient significantly, while maintaining the electromechanical coupling coefficient, and also reducing the dielectric loss, regardless of the ratio of substitution. Since Nb and Sb are both elements in the vanadium family and have common properties, those skilled in the art should easily understand that changing the blending ratio of these elements would not affect the characteristics of the formed piezoelectric ceramics in any significant way.

As mentioned above, piezoelectric ceramics according to various embodiments of the present invention can prevent dielectric breakdown caused by concentration of electric field or stress because precipitation of bulky crystal grains is suppressed. Piezoelectric ceramics according to various embodiments of the present invention can be suitably used for thin piezoelectric layers, because the internal polycrystalline structure is fine and uniform. For example, use of the present invention for the piezoelectric ceramic layer of an actuator or other laminated piezoelectric device would reduce the distance between electrodes because of the thinness of the formed piezoelectric ceramic layer, which allows more layers to be laminated per unit volume. Because of their relatively high mechanical quality coefficient and relatively low dielectric constant, piezoelectric ceramics according to various embodiments of the present invention can also be used favorably for various sensors and other devices that require generation of high voltage in response to mechanical stress.

The above explained the piezoelectric ceramics proposed by the present invention. It should be noted that the present invention is not at all limited to the aforementioned examples, but various variations are also acceptable as long as they do not deviate from the intent and purpose of the present invention.

The invention claimed is:

1. A piezoelectric ceramic constituted by a polycrystal comprising:
a main phase constituted by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively); and
a sub-phase constituted by $K_3Nb_3O_6Si_2O_7$;
wherein 0.02 mol to 5.0 mols of Cu compound is contained relative to 100 mols of the main phase in equivalent CuO.

2. A piezoelectric ceramic according to claim 1, wherein, when its composition formula is expressed by $(1-a)[K_{1-x}Na_x]_{1-y}Li_y[Nb_{1-z-w}Ta_zSb_w]O_3 + aK_3Nb_3O_6Si_2O_7$ (where a indicates the mol ratio), this mol ratio is specified by 0.003 a 0.10.

3. A piezoelectric ceramic according to claim 2, wherein, when analyzed by the X-ray diffraction method, the ratio of line intensity $I_1$ along the most intensive line in the diffraction profile corresponding to the aforementioned main phase on one hand, and the line intensity $I_2$ along the most intensive line in the diffraction profile corresponding to the aforementioned sub phase on the other, or $I_2/I_1$, is between 0.6% and 8.0%.

4. A piezoelectric ceramic according to claim 2, wherein the aforementioned Cu compound is at least one compound selected from the group that includes $CuNb_2O_6$, $K_4CuNb_8O_{23}$, $K_5Cu_2Nb_{11}O_{30}$ and $K_{5.4}Cu_{1.3}Ta_{10}O_{29}$.

5. A piezoelectric device comprising:
a piezoelectric ceramic layer constituted by the piezoelectric ceramic according to claim 2;
a first electrode positioned on the back surface of the piezoelectric ceramic layer; and
a second electrode positioned on the front surface of the piezoelectric ceramic layer in a manner corresponding to the first electrode.

6. A piezoelectric device according to claim 5, comprising:
a first terminal electrode that connects electrically to multiple units of the first electrode; and
a second terminal electrode that connects electrically to multiple units of the second electrode;
wherein the first electrodes and the second electrodes are stacked on top of one another alternately via multiple units of the piezoelectric ceramic layer.

7. A piezoelectric device comprising:
a substrate on which the piezoelectric ceramic according to claim 2 is formed;
a first electrode formed on the front surface of the piezoelectric ceramic layer; and
a second electrode formed on the front surface of the piezoelectric ceramic layer in a manner facing the first electrode.

8. A piezoelectric device comprising:
a substrate;
a piezoelectric ceramic layer constituted by the piezoelectric ceramic according to claim 2 and formed on the substrate;
a first electrode formed on the front surface of the piezoelectric ceramic layer; and
a second electrode formed on the back surface of the piezoelectric ceramic layer in a manner corresponding to the first electrode.

9. A piezoelectric device according to claim 8, wherein said piezoelectric device comprises:
a substrate;
a first terminal electrode that connects electrically to multiple units of the first electrode; and
a second terminal electrode that connects electrically to multiple units of the second electrode;
wherein the first electrodes and the second electrodes are stacked on top of one another alternately via multiple units of the piezoelectric ceramic layer.

10. A piezoelectric ceramic according to claim 1, wherein, when analyzed by the X-ray diffraction method, the ratio of line intensity $I_1$ along the most intensive line in the diffraction profile corresponding to the aforementioned main phase on one hand, and the line intensity $I_2$ along the most intensive line in the diffraction profile corresponding to the aforementioned sub-phase on the other, or $I_2/I_1$, is between 0.6% and 8.0%.

11. A piezoelectric ceramic according to claim 1, wherein the aforementioned Cu compound is at least one compound selected from the group that includes $CuNb_2O_6$, $K_4CuNb_8O_{23}$, $K_5Cu_2Nb_{11}O_{30}$ and $K_{5.4}Cu_{1.3}Ta_{10}O_{29}$.

12. A piezoelectric device comprising:
a piezoelectric ceramic layer constituted by the piezoelectric ceramic according to claim 1;
a first electrode positioned on the back surface of the piezoelectric ceramic layer; and
a second electrode positioned on the front surface of the piezoelectric ceramic layer in a manner corresponding to the first electrode.

13. A piezoelectric device according to claim 12, comprising:
- a first terminal electrode that connects electrically to multiple units of the first electrode; and
- a second terminal electrode that connects electrically to multiple units of the second electrode;
- wherein the first electrodes and the second electrodes are stacked on top of one another alternately via multiple units of the piezoelectric ceramic layer.

14. A piezoelectric device comprising:
a substrate on which the piezoelectric ceramic according to claim 1 is formed;
a first electrode formed on the front surface of the piezoelectric ceramic layer; and
a second electrode formed on the front surface of the piezoelectric ceramic layer in a manner corresponding to the first electrode.

15. A piezoelectric device comprising:
a substrate;
a piezoelectric ceramic layer constituted by the piezoelectric ceramic according to claim 1 and formed on the substrate;
a first electrode formed on the front surface of the piezoelectric ceramic layer; and
a second electrode formed on the back surface of the piezoelectric ceramic layer in a manner corresponding to the first electrode.

16. A piezoelectric device according to claim 15, wherein said piezoelectric device comprises:
a substrate;
a first terminal electrode that connects electrically to multiple units of the first electrode; and
a second terminal electrode that connects electrically to multiple units of the second electrode;
wherein the first electrodes and the second electrodes are stacked on top of one another alternately via multiple units of the piezoelectric ceramic layer.

17. A manufacturing method of a piezoelectric ceramic comprising:
- a step to obtain a perovskite composition expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively);
- a step to obtain a composition expressed by $K_3Nb_3O_6Si_2O_7$;
- a step to mix the aforementioned $[K_{1-x}Na_x]_{1-y}Li_y[Nb_{1-z-w}Ta_zSb_w]O_3$ and the $K_3Nb_3O_6Si_2O_7$;
- a step to add Cu compound to the obtained mixture of both compositions by a ratio of 0.02 mol to 5.0 mols relative to 100 mols of the aforementioned $[K_{1-x}Na_x]_{1-y}Li_y[Nb_{1-z-w}Ta_zSb_w]O_3$ in equivalent CuO and mix the components together; and
- a step to form and sinter this mixture to which Cu compound has been added.

18. A manufacturing method of a piezoelectric ceramic according to claim 17, characterized in that in the step to mix the aforementioned main phase and sub-phase, mixing is performed so that $0.003 \leq a \leq 0.10$ is achieved in (1-a) $[K_{1-x}Na_x]_{1-y}Li_y[Nb_{1-z-w}Ta_zSb_w]O_3 + aK_3Nb_3O_6Si_2O_7$ (where a indicates the mol ratio).

19. A manufacturing method of a piezoelectric ceramic comprising:
- a step to obtain a composition expressed by $K_3Nb_3O_6Si_2O_7$;
- a step to mix potassium compound, sodium compound, lithium compound, niobium compound, tantalum compound and antimony compound so as to obtain a perovskite compound expressed by $[K_{1-x}Na_x]_{1-y}Li_y[Nb_{1-z-w}Ta_zSb_w]O_3$ (where x, y, z and w are mol ratios specified by $0 \leq x \leq 1$, $0 \leq y \leq 1$, $0 \leq z \leq 1$, and $0 \leq w \leq 1$, respectively) and mix this compound with the aforementioned $K_3Nb_3O_6Si_2O_7$;
- a step to pre-sinter the obtained mixture;
- a step to add Cu compound to this pre-sintered mixture by a ratio of 0.02 mol to 5.0 mols relative to 100 mols of the aforementioned $[K_{1-x}Na_x]_{1-y}Li_y[Nb_{1-z-w}Ta_zSb_w]O_3$ in equivalent CuO and mix the components together; and
- a step to form and sinter the obtained mixture.

20. A manufacturing method of a piezoelectric ceramic according to claim 19,
characterized in that in the step to mix the aforementioned main phase and sub phase, mixing is performed so that 0.003 a 0.10 is achieved in (1-a) $[K_{1-x}Na_x]_{1-y}Li_y[Nb_{1-z-w}Ta_zSb_w]O_3 + aK_3Nb_3O_6Si_2O_7$ (where a indicates the mol ratio).

* * * * *